United States Patent
Park et al.

(10) Patent No.: US 11,153,064 B2
(45) Date of Patent: Oct. 19, 2021

(54) CLOCK AND DATA RECOVERY DEVICE AND TRAINING METHOD THEREOF

(71) Applicants: SK hynix Inc., Icheon (KR); Seoul National University R&DB Foundation, Seoul (KR)

(72) Inventors: Kwanseo Park, Seoul (KR); Deog-Kyoon Jeong, Seoul (KR)

(73) Assignees: SK hynix Inc., Icheon (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 16/951,814

(22) Filed: Nov. 18, 2020

(65) Prior Publication Data

US 2021/0258137 A1    Aug. 19, 2021

(30) Foreign Application Priority Data

Feb. 14, 2020 (KR) .................. 10-2020-0018475

(51) Int. Cl.
*H04L 7/00* (2006.01)
*H03L 7/08* (2006.01)

(52) U.S. Cl.
CPC .......... *H04L 7/0054* (2013.01); *H03L 7/0807* (2013.01)

(58) Field of Classification Search
CPC ..... H04L 7/0054; H04L 1/205; H04L 7/0083; H03L 7/0807
USPC ........ 375/355, 371, 373–376, 326, 327, 344
See application file for complete search history.

(56) References Cited

U.S. PATENT DOCUMENTS 9,882,703 B1 * 1/2018 Xu .................. H04L 7/0083
10,135,604 B1   11/2018 Dehlaghi et al.
2009/0097541 A1 * 4/2009 Aziz .................... H04L 1/205
                                                        375/233

FOREIGN PATENT DOCUMENTS

KR            101666709 B1    10/2016

OTHER PUBLICATIONS

Guanghua. Shu et al., "A 4-to-10.5 GB/s continuous-rate digital clock and data recovery with automatic frequency acquisition," IEEE Journal of Solid-State Circuits, Feb. 2016, pp. 428-439, vol. 51, No. 2.

Jahoon Jin et al., "A 0.7-3.0-GB/s dual-mode temperature-tolerant referenceless CDR with a deadzone-compensated frequency detector," IEEE Journal of Solid-State Circuits, Oct. 2018, pp. 2994-3003,vol. 53, No. 10.

(Continued)

*Primary Examiner* — Phuong Phu

(57) ABSTRACT

A clock and data recovery (CDR) device includes a data sampler configured to output a data signal by sampling an input signal according to a first clock signal; an edge sampler configured to output an edge signal by sampling the input signal according to a second clock signal, the second clock signal having substantially the same frequency as the first clock signal and having substantially an opposite phase to the first clock signal; an error detection circuit configured to identify a plurality of patterns based on the data signal and the edged signal and generate an error signal according to occurrence frequencies of the identified plurality of patterns; and an oscillation control circuit configured to generate a first oscillation control signal to control an oscillator generating the first and second clock signal according to the error signal.

18 Claims, 12 Drawing Sheets

(56) References Cited

OTHER PUBLICATIONS

Kwanseo Park et al., "A 4-to-20Gb/s 1.87pJ/b referenceless digital CDR with unlimited frequency detection capability in 65nm CMOS," 2019 Symposium on VLSI Circuits Digest of Technical Papers, Jun. 2019, pp. 194-195.
Takashi Masuda et al., "A 12Gb/s 0.9mW/GB/s wide-bandwidth injection-type CDR in 28nm CMOS with reference-Free frequency capture," ISSCC 2016 / Session 10 / Advanced Wireline Transceivers and PLLs / 10.4, Feb. 2016, pp. 188-189.
Wahid Rahman et al., "A 22.5-to-32 GB/s 3.2pJ/b referenceless baud-rate digital CDR with DFE and CTLE in 28nm CMOS," ISSCC 2017 / Session 6 / Ultra-High-Speed Wireline / 6.6,Feb. 2017, pp. 120-121.

\* cited by examiner

<Prior Art>

| Pattern | "000" | "001" | "010" | "011" | "100" | "101" | "110" | "111" |
|---|---|---|---|---|---|---|---|---|
| | 0 | 1 | 2 | 3 | 4 | 5 | 6 | 7 |
| Group | 0 | 1 | 2 | 3 | 3 | 2 | 1 | 0 |

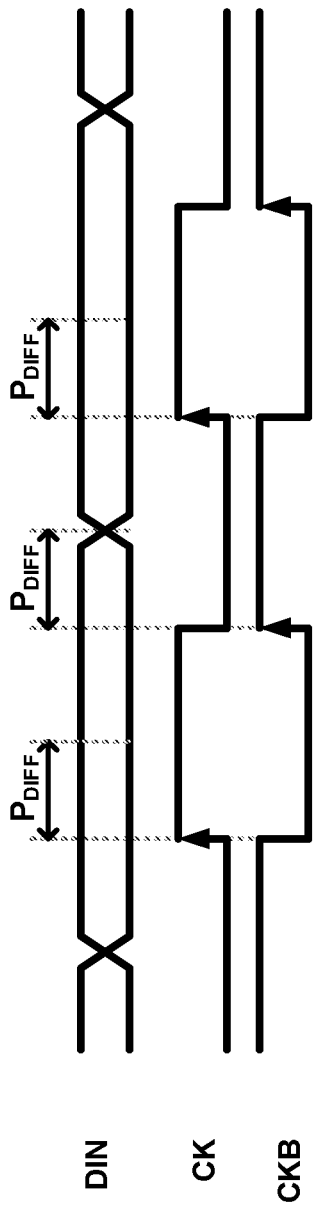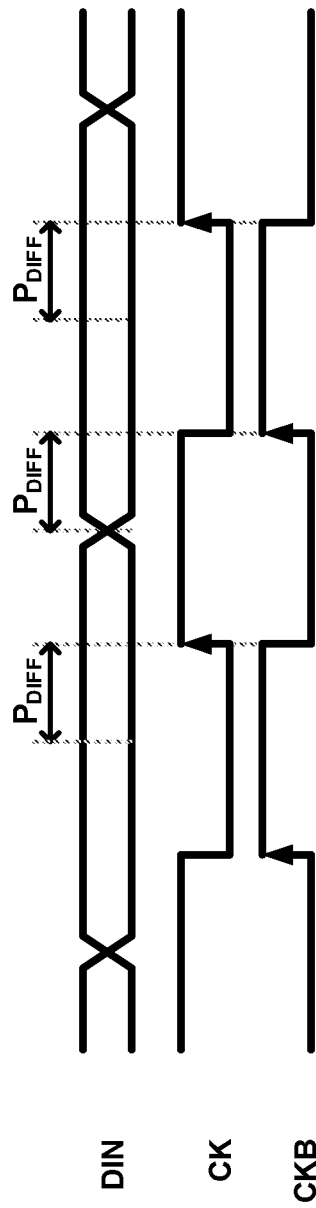

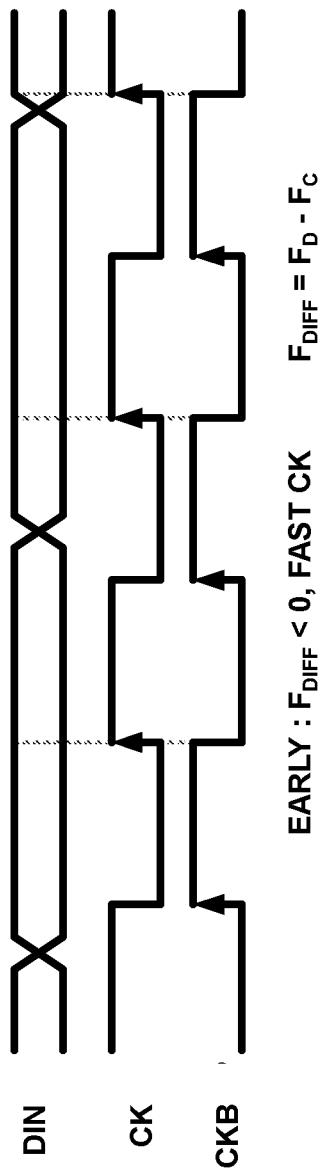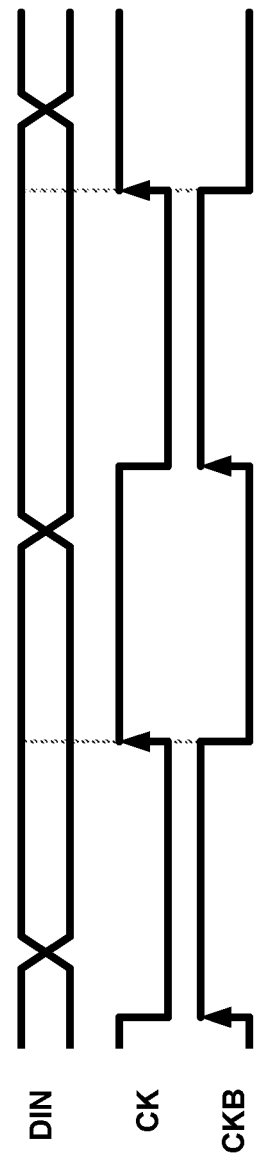

FIG. 8

| Pattern | "000" | "001" | "010" | "011" | "100" | "101" | "110" | "111" |
|---|---|---|---|---|---|---|---|---|
| | 0 | 1 | 2 | 3 | 4 | 5 | 6 | 7 |
| Group | 0 | 1 | 2 | 3 | 3 | 2 | 1 | 0 |
| Weight | 0 | -1 | 0 | 1 | 1 | 0 | -1 | 0 |

FIG. 11

| Pattern | "000" | "001" | "010" | "011" | "100" | "101" | "110" | "111" |
|---|---|---|---|---|---|---|---|---|
| Group | 0 | 1 | 2 | 3 | 4 | 5 | 6 | 7 |
| | 0 | 1 | 2 | 3 | 3 | 2 | 1 | 0 |
| Weight | -0.32 | -0.34 | 1 | 0.98 | 0.98 | 1 | -0.34 | -0.32 |

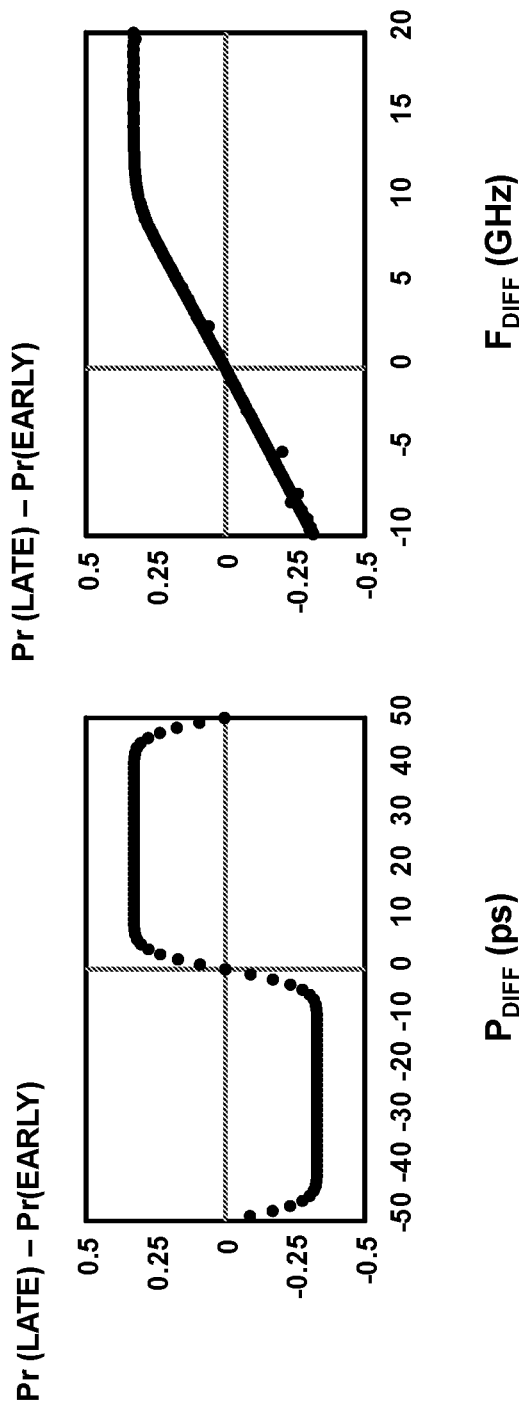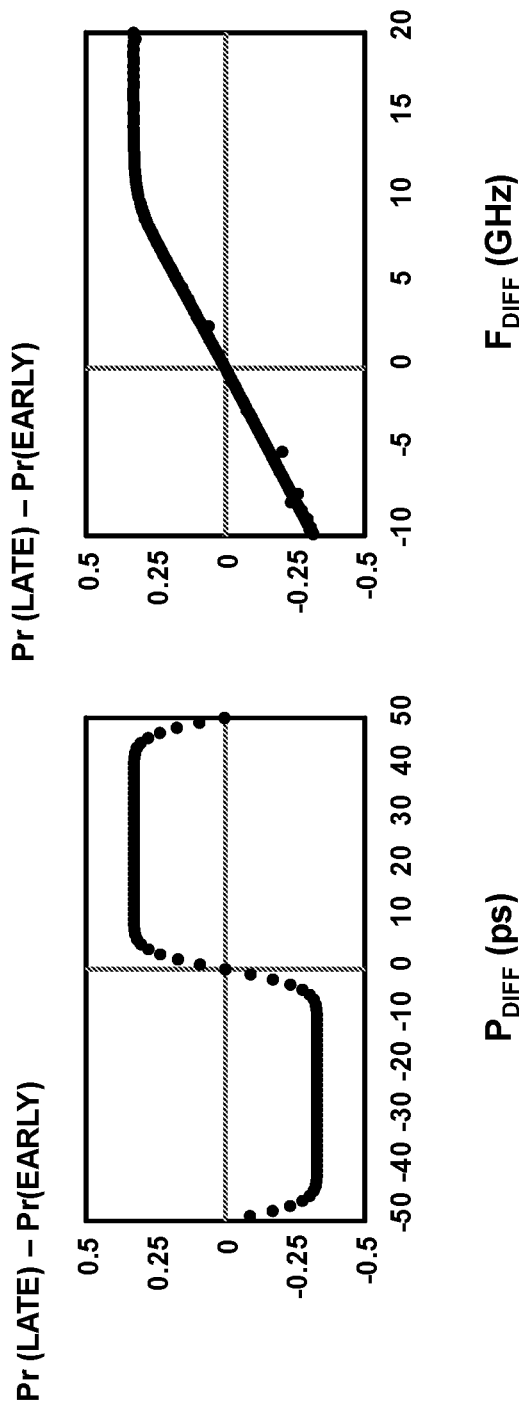

CLOCK AND DATA RECOVERY DEVICE AND TRAINING METHOD THEREOF

CROSS-REFERENCE TO RELATED APPLICATION

The present application claims priority under 35 U.S.C. § 119(a) to Korean Patent Application No. 10-2020-0018475, filed on Feb. 14, 2020, which is incorporated herein by reference in its entirety.

BACKGROUND

1. Technical Field

Various embodiments generally relate to a clock and data recovery device using machine learning technology and a training method thereof.

2. Related Art

Recognition technology based on neural networks shows relatively high recognition performance.

A clock and data recovery (CDR) device recovers clock signal and data signal from an input signal received by a receiver.

CDR devices can be classified into a first type using an external clock and a second type without using an external clock. A CDR device of the second type is referred as a referenceless CDR device.

FIG. 1 is a block diagram showing a conventional CDR device.

The conventional CDR device includes a clock recovery circuit 11 that generates a recovery clock signal from input signal DIN and a retiming circuit 12 that generates a recovered data by adjusting the timing of the input signal DIN according to the recovered clock signal.

As the retiming circuit 12, a D flip-flop can be used.

Since the referenceless CDR device does not use an external clock, it is suitable to implement a continuous rate CDR device capable of recovering clock signal and data signal over a wide range of frequencies.

Various conventional referenceless CDR devices are known.

However, such a conventional referenceless CDR device may occupy a relatively large hardware area and increase power consumption.

SUMMARY

In accordance with an embodiment of the present disclosure, a clock and data recovery (CDR) device includes a data sampler configured to output a data signal by sampling an input signal according to a first clock signal; an edge sampler configured to output an edge signal by sampling the input signal according to a second clock signal, the second clock signal having substantially the same frequency as the first clock signal and having substantially an opposite phase to the first clock signal; an error detection circuit configured to identify a plurality of patterns based on the data signal and the edge signal and generate an error signal according to occurrence frequencies of the plurality of patterns; and an oscillation control circuit configured to generate a first oscillation control signal to control an oscillator generating the first and second clock signals according to the error signal.

In accordance with an embodiment of the present disclosure, a training method of a clock and data recovery (CDR) device, wherein the CDR device samples an input signal according to a first clock signal to generate a data signal, samples the input signal according to a second clock signal to generate an edge signal, identifies a plurality of patterns based on the data signal and the edge signal, and generates, and generates an error signal by calculating a plurality of weights and occurrence frequencies of the plurality of patterns, the training method includes generating a plurality of histograms according to a phase difference between the input signal and a clock signal, or a frequency difference between the input signal and the clock signal, or both, the clock signal being the first clock signal or the second clock signal; calculating the plurality of weights based on a representative histogram selected from the plurality of histograms; generating a phase difference graph and a frequency difference graph by applying the plurality of weights to the plurality of histograms; and determining whether the phase difference graph and the frequency difference graph satisfy a predetermined condition.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate various embodiments, and explain various principles and beneficial aspects of those embodiments.

FIGS. 5A and 5B each illustrates a phase difference between an input signal and a clock signal according to an embodiment of the present disclosure.

FIGS. 6A and 6B each illustrates a frequency difference between an input signal and a clock signal according to an embodiment of the present disclosure.

FIG. 8 illustrates a table representing weights calculated from histograms in FIGS. 7A and 7B according to an embodiment of the present disclosure.

FIG. 11 illustrates a table representing weights calculated from the histograms in FIGS. 10A and 10B according to an embodiment of the present disclosure.

FIGS. 12A and 12B illustrate a phase difference graph and a frequency difference graph generated from the weights of FIG. 11, respectively, according to embodiments of the present disclosure.

DETAILED DESCRIPTION

The following detailed description references the accompanying figures in describing illustrative embodiments consistent with this disclosure. The embodiments are provided for illustrative purposes and are not exhaustive. Additional embodiments not explicitly illustrated or described and modifications are possible. The detailed description is not meant to limit this disclosure. Rather, the scope of the present disclosure is defined in accordance with claims and equivalents thereof. Also, throughout the specification, reference to "an embodiment" or the like is not necessarily to only one embodiment, and different references to any such phrase are not necessarily to the same embodiment(s).

Figure 1:
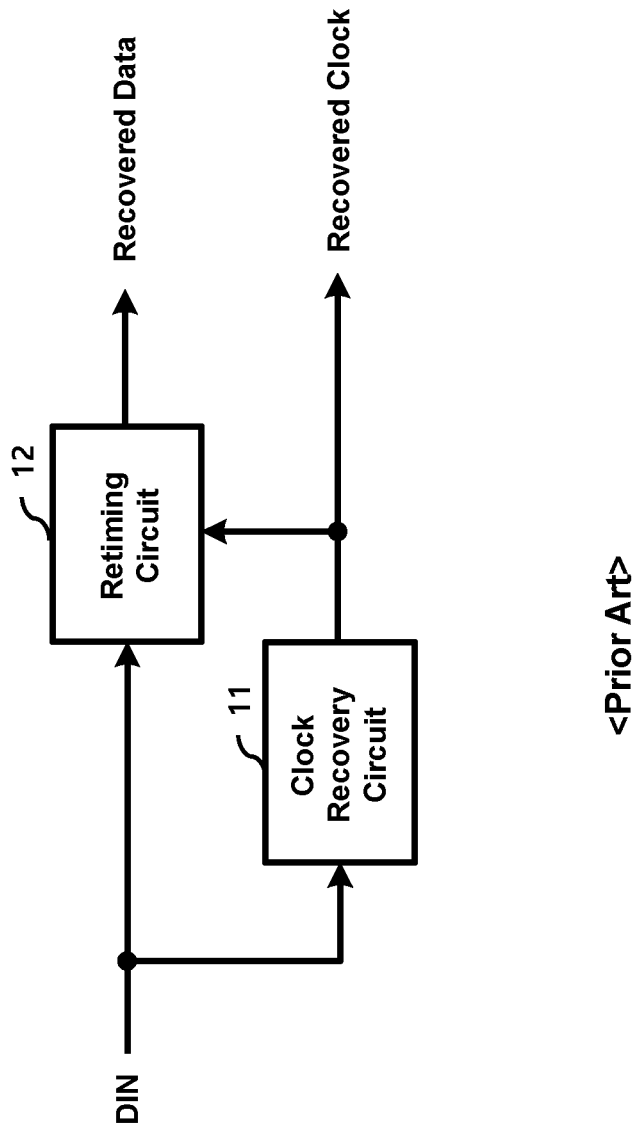
FIG. 1 illustrates a conventional clock and data recovery device.
Figure 2:
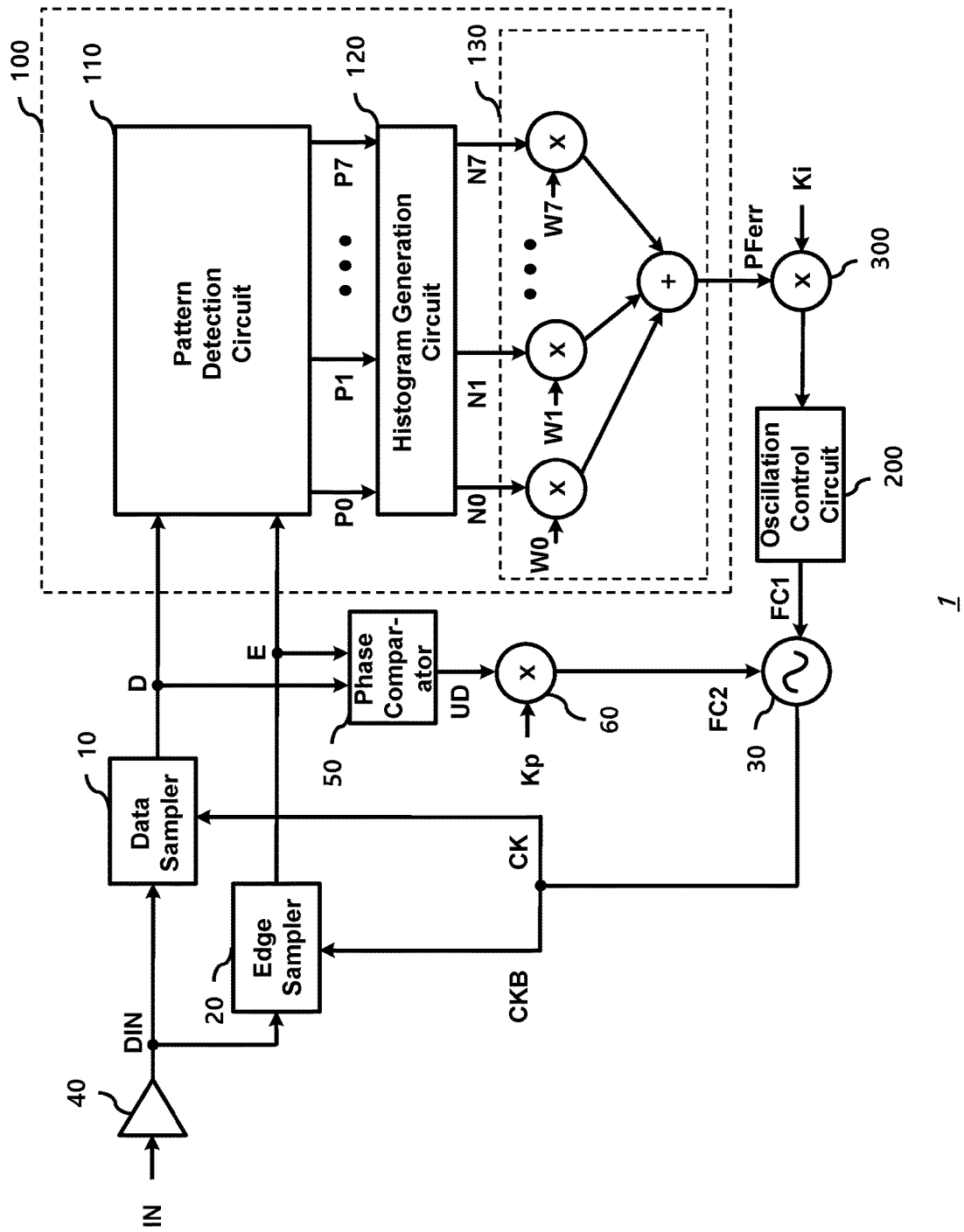
FIG. 2 illustrates a clock and data recovery (CDR) device according to an embodiment of the present disclosure.

FIG. 2 illustrates a clock and data recovery (CDR) device 1 according to an embodiment of the present disclosure.

The CDR device 1 according to an embodiment includes a data sampler 10, an edge sampler 20, an oscillator 30, an error detection circuit 100, and an oscillation control circuit 200.

The CDR device 1 may further include an analog receiving circuit 40 for outputting an input signal DIN from a received signal IN.

The analog receiving circuit 40 may be implemented using a continuous time linear equalizer (CTLE), which is well known and thus detailed descriptions thereof will be omitted for the interest of brevity.

If the analog receiving circuit 40 is not included, the received signal IN is the same as the input signal DIN.

The received signal IN is substantially the same as the input signal DIN except that the input signal DIN has improved eye characteristics relative to the received signal IN.

The oscillator 30 outputs a first clock signal CK and a second clock signal CKB according to a first oscillation control signal FC1.

The first clock signal CK and the second clock signal CKB are two signals having substantially the opposite phases and have substantially the same frequency.

Hereinafter, the first clock signal CK and the second clock signal CKB may be collectively referred to as a clock signal.

The data sampler 10 samples the input signal DIN according to the first clock signal CK and outputs the data signal D.

The edge sampler 20 samples the input signal DIN according to the second clock signal CKB and outputs the edge signal E.

The error detection circuit 100 generates an error signal PFerr according to the data signal D and the edge signal E.

The error signal PFerr may include both phase error information and frequency error information, and thus may be referred to as a phase frequency error signal.

In an embodiment, the error detection circuit 100 calculates frequency of occurrences of a data-edge pattern generated by combining the data signal D and the edge signal E, and generates the error signal PFerr. Hereinafter, the data-edge pattern may be referred to as the pattern.

Figures 3A, 3B:
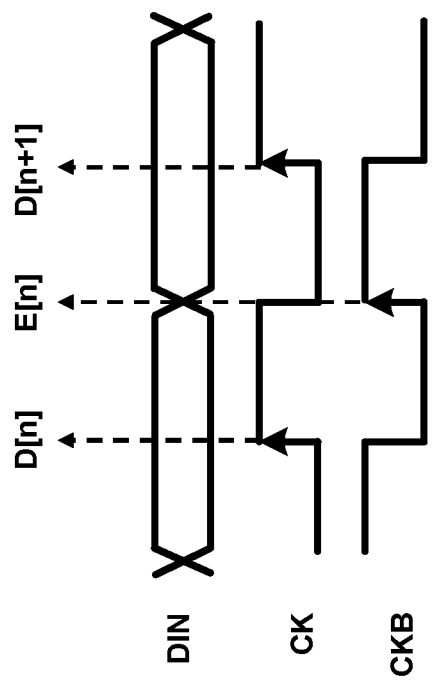
FIGS. 3A and 3B illustrate determining data-edge patterns according to an embodiment of the present disclosure.

FIGS. 3A and 3B illustrate determining data-edge patterns according to an embodiment of the present disclosure.

The input signal DIN is sampled at the rising edge of the first clock signal CK to output the data signal D, and the input signal DIN is sampled at the rising edge of the second clock signal CKB to output the edge signal E.

In the embodiment shown in FIG. 3A, a data-edge pattern is determined using a data signal D[n], an edge signal E[n], and a data signal D[n+1] that are sequentially provided from the data sampler 10 and the edge sampler 20. For example, the data signal D[n] indicates a first logic value (e.g., a logic low value "0") of the input signal DIN sampled at a first time corresponding to a rising edge of the first clock signal CK, the edge signal E[n] indicates a second logic value (e.g., a logic high value "1") of the input signal sampled at a second time corresponding to a rising edge of the second clock signal CKB, and the data signal D[n+1] indicates a second logic value (e.g., a logic high value "1") of the input signal DIN sampled at a third time corresponding to a rising edge of the first clock signal CK.

In the embodiment of FIG. 3B, there are 8 patterns and the pattern signals P0 to P7 respectively correspond to these 8 patterns. For example, when the data signal D[n] indicates a logic low value and each of the edge signal E[n] and the data signal D[n+1] indicates a logic high value as shown in FIG. 3A, a data-edge pattern may be a fourth pattern of "011" corresponding to a fourth pattern signal P3.

In this embodiment, patterns 0 and 7 can be grouped into $0^{th}$ group G0, patterns 1 and 6 into $1^{st}$ group G1, patterns 2 and 5 into $2^{nd}$ group G2, and patterns 3 and 4 into $3^{rd}$ group G3.

In an embodiment, probabilities of occurrences of the patterns in the same group show the same tendency, which will be described below in detail.

Returning to FIG. 2, the error detection circuit 100 includes a pattern detection circuit 110, a histogram generation circuit 120, and an error calculation circuit 130.

The pattern detection circuit 110 identifies patterns using the data signal D and the edge signal E and generates pattern signals P0 to P7 corresponding to the patterns. For example, when the pattern detection circuit 110 identifies a specific data-edge pattern (e.g., the fourth data-edge pattern "011") using the data signal D and the edge signal E, the pattern detection circuit 110 may generate a pattern signal (e.g., the fourth pattern signal P3) corresponding to the identified specific data-edge pattern to have a first logic value (e.g., a high logic value) while generating the remaining pattern signals to have a second logic value (e.g., a low logic value).

Since the pattern detection circuit 110 can be implemented by a person skilled in the art by combining logic gates, detailed descriptions thereof will be omitted for the interest of brevity.

The histogram generation circuit 120 generates a histogram by accumulating respective numbers of occurrences of the pattern signals P0 to P7 for a predetermined time interval. For example, the histogram generation circuit 120 may accumulate the number of occurrences of a corresponding one of the pattern signals P0 to P7 by counting the number of asserting the corresponding one of the pattern signals P0 to P7 during a predetermined time interval.

To this end, the histogram generation circuit 120 outputs a plurality of frequency signals N0 to N7 indicating occurrence frequencies and corresponding to pattern signals P0 to P7, respectively.

The error calculation circuit 130 calculates the error signal PFerr from frequencies N0 to N7 and weights W0 to W7 corresponding to the frequencies N0 to N7, respectively.

The weights may be obtained through a training method similar to machine learning, and the training method for determining the weights will be described below in detail.

The error signal PFerr may be expressed as the following Equation 1:

$$PF_{err} = \sum_{i=0}^{7} Wi \times Ni.$$ [Equation 1]

The oscillation control circuit 200 generates the first oscillation control signal FC1 according to the error signal PFerr.

The oscillation control circuit 200 may accumulate the error signal PFerr for a predetermined time interval and modulate the error signal PFerr to generate the first oscillation control signal FC1.

The oscillation control circuit 200 generates the first oscillation control signal FC1 so that the oscillator 30 operates in a direction in which the error signal PFerr is reduced by a negative feedback.

Since the negative feedback technique itself is conventional, the oscillation control circuit 200 can be implemented by a person skilled in the art and a detailed implementation of the oscillation control circuit 200 will be omitted for the interest of brevity.

The oscillator 30 adjusts the frequencies of the first clock signal CK and the second clock signal CKB according to the first oscillation control signal FC1.

The CDR device 1 may further include a first multiplier 300 that multiplies the error signal PFerr by a first constant Ki. The first constant Ki may have a predetermined value.

In this case, the output of the first multiplier 300 is provided to the oscillation control circuit 200, and the oscillation control circuit 200 may generate the first oscillation control signal FC1 according to the output of the first multiplier 300.

When the value of the error signal PFerr converges to 0, it can be seen that the clock signal and the data signal are recovered normally, and this state may be referred to as a locked state.

In this way, the error detection circuit 100 controls the oscillator 30 in accordance with the error signal PFerr generated according to the pattern of the data signal D and the edge signal E, so that the clock signal and the data signal are normally recovered from the input signal DIN.

The CDR device 1 may further include a phase comparator 50.

The phase comparator 50 may generate a comparison signal UD by comparing the phases of the data signal D and the edge signal E.

The CDR device 1 may further include a second multiplier 60 that multiplies the comparison signal UD by a second constant Kp. The second constant Kp may have a predetermined value.

The output of the second multiplier 60 may be provided as a second oscillation control signal FC2, and the oscillator 30 may control frequency of the first clock signal CK and the second clock signal CKB according to the second oscillation control signal FC2.

While the CDR device 1 operates in the locked state, it may deviate from the locked state temporarily for various reasons.

In this case, the comparison signal UD output from the phase comparator 50 can be used to make the CDR device 1 quickly return to the locked state.

The oscillator 30 controls the frequency of the clock signal CK to make the CDR device 1 return to the locked state according to the second oscillation control signal FC2.

Figure 4:
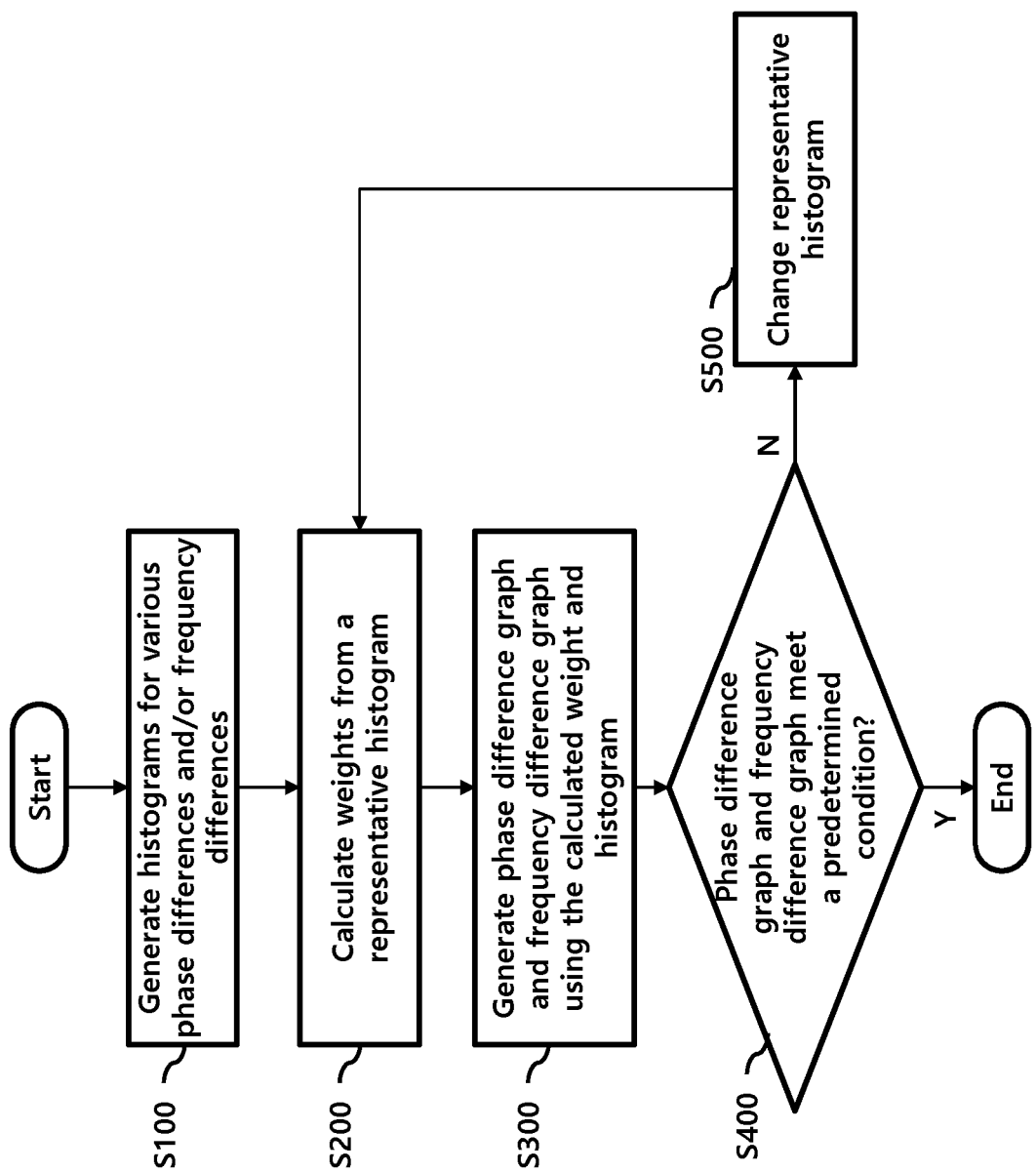
FIG. 4 is a flowchart illustrating a training method of a CDR device according to an embodiment of the present disclosure.

FIG. 4 is a flowchart showing a training method of a CDR device (e.g., the CDR device 1 in FIG. 2) according to an embodiment of the present disclosure.

The training method according to an embodiment of the present disclosure is similar to machine learning, which will be described below in detail.

First, histograms are generated according to various phase differences, or frequency differences, or both at step S100.

In this embodiment, a Pseudo Random Bit Sequence (PRBS) signal is used as the input signal DIN.

FIGS. 5A and 5B each illustrate a process of generating a histogram based on a phase difference according to an embodiment.

In FIGS. 5A and 5B, it is assumed that the oscillator 30 has reached frequency locking. That is, the frequencies of the first clock signal CK and the second clock signal CKB are substantially the same as a frequency of a clock signal used by a transmitter. In this embodiment, it is assumed that the frequency is 10 GHz.

The phase difference $P_{DIFF}$ may be determined by measuring a phase difference between a rising edge of the second clock signal CKB and an edge of the input signal DIN.

As shown in FIG. 5A, when the rising edge of the second clock signal CKB leads the edge of the input signal DIN, the phase difference $P_{DIFF}$ is assumed to have a negative value, and this case is expressed as "EARLY."

As shown in FIG. 5B, when the rising edge of the second clock signal CKB lags the edge of the input signal DIN, the phase difference $P_{DIFF}$ is assumed to have a positive value, and this case is expressed as "LATE."

As shown in FIGS. 5A and 5B, while the phase difference $P_{DIFF}$ is set to various values and the PRBS signal is provided as the input signal DIN, a stream of the data signal D and the edge signal E may be generated.

At this time, the streams of the data signal D and the edge signal E can be generated through experiments such as computer simulation.

In this case, the input signal DIN, the first clock signal CK, and the second clock signal CKB may not be provided to a physical circuit shown in FIG. 2 to generate a stream of the data signals D and the edge signals E.

A histogram may be generated by accumulating stream of the data signals D and the edge signals E for a predetermined time interval.

FIGS. 6A and 6B each illustrate a process of generating a histogram based on a frequency difference according to an embodiment.

The frequency difference corresponds to a difference between frequency $F_D$ of the input signal DIN and frequency $F_c$ of the first clock signal CK.

In FIGS. 6A and 6B, it is assumed that a time interval between two edges of the input signal DIN is equal to a single period of the input signal DIN.

As shown in FIG. 6A, when the frequency $F_c$ of the first clock signal CK is greater than the frequency $F_D$ of the input signal DIN, the frequency difference $F_{DIFF}$ is assumed to have a negative value, and this case is expressed as "EARLY."

As shown in FIG. 6B, when the frequency $F_c$ of the first clock signal CK is less than the frequency $F_D$ of the input signal DIN, the frequency difference $F_{DIFF}$ is assumed to have a positive value, and this case is expressed as "LATE."

As in FIGS. 6A and 6B, while the frequency difference $F_{DIFF}$ is set to various values and the PRBS signal is provided as the input signal DIN, a stream of the data signals D and the edge signals E may be generated.

As described above, the stream of the data signals D and the edge signals E can be generated through experiments such as computer simulation.

Figure 7A:
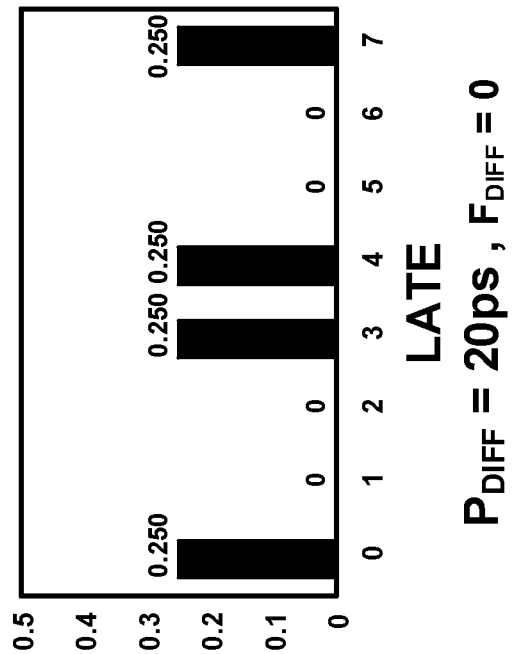
FIGS. 7A and 7B each illustrate a histogram based on a phase difference according to an embodiment of the present disclosure.
Figure 7B:
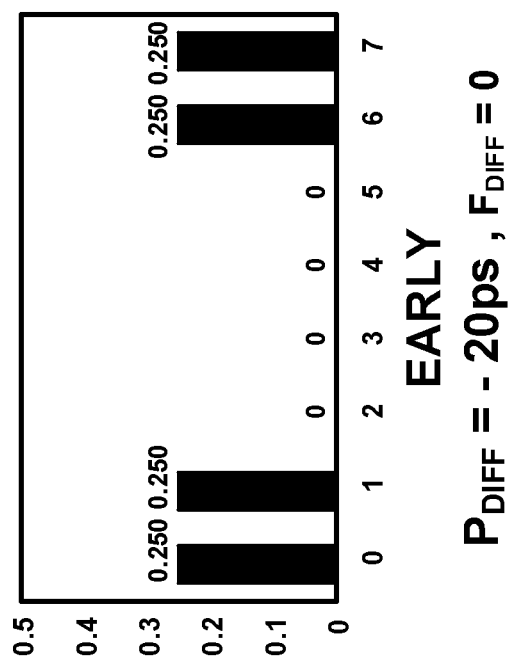

FIG. 7A shows a histogram for a case where the phase difference $P_{DIFF}$ is set to −20 ps and FIG. 7B shows a histogram for a case where the phase difference $P_{DIFF}$ is set to +20 ps. In both cases, it is assumed that the frequency difference $F_{DIFF}$ is 0 and the frequency is locked.

At this time, the horizontal axis represents a pattern and the vertical axis represents probability of occurrence of each pattern.

Figure 10A:
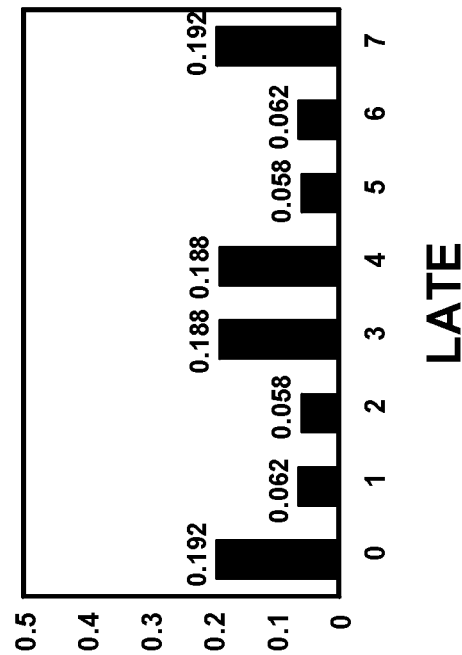
FIGS. 10A and 10B each illustrate a histogram based on a phase difference and a frequency difference according to an embodiment of the present disclosure.
Figure 10B:
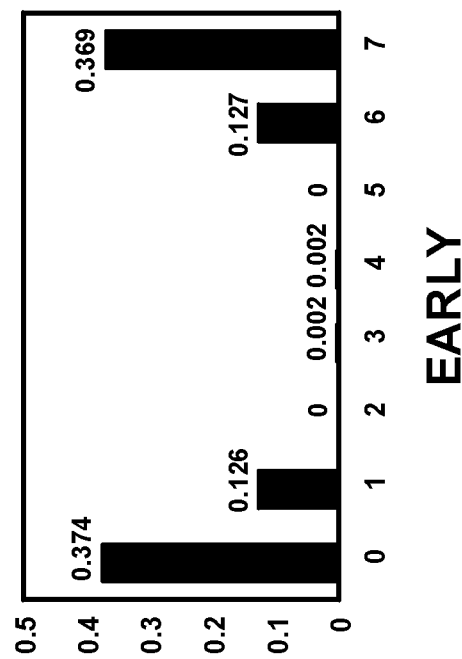

FIG. 10A shows a histogram for a case where the phase difference $P_{DIFF}$ is set to −20 ps and the frequency difference $F_{DIFF}$ is set to −9.7 GHz and FIG. 10B shows a histogram for a case where the phase difference $P_{DIFF}$ is set to +20 ps and the frequency difference $F_{DIFF}$ is set to +9.7 GHz.

In order to generate a histogram as shown in FIG. 10A, a histogram when the phase difference $P_{DIFF}$ is −20 ps and the frequency difference $F_{DIFF}$ is 0 as shown in FIG. 5A and a histogram when the phase difference $P_{DIFF}$ is 0 and the frequency difference $F_{DIFF}$ is −9.7 GHz as shown in FIG. 6A may be combined.

In order to combine two histograms as a histogram, occurrence frequencies of the two histograms may be linearly combined, but combining method is not necessarily limited thereto. For example, an occurrence frequency (e.g., a probability of occurrence) of a specific pattern (e.g., a first pattern 0) in FIG. 10A may be obtained by calculating an average of a first occurrence frequency of the specific pattern in a first histogram and a second occurrence frequency of the specific pattern in a second histogram, the first histogram being obtained when the phase difference $P_{DIFF}$ is −20 ps and the frequency difference $F_{DIFF}$ is 0 as shown in FIG. 5A and the second histogram being obtained when the phase difference $P_{DIFF}$ is 0 and the frequency difference $F_{DIFF}$ is −9.7 GHz as shown in FIG. 6A.

In order to generate a histogram as shown in FIG. 10B, a histogram when the phase difference $P_{DIFF}$ is +20 ps and the frequency difference $F_{DIFF}$ is 0 as shown in FIG. 5B and a histogram when the phase difference $P_{DIFF}$ is 0 and the frequency difference $F_{DIFF}$ is +9.7 GHz as shown in FIG. 6B may be combined.

Returning to FIG. 4, a weight is calculated by selecting one of the variously prepared histograms as a representative histogram at step S200.

FIG. 8 is a table illustrating weights for patterns calculated by selecting the histograms of FIGS. 7A and 7B as a representative histogram according to an embodiment.

In the embodiment of FIG. 0.8, a weight corresponding to a pattern is determined as a difference between conditional probability of being in the "LATE" state under a condition that the corresponding pattern has occurred and conditional probability of being in the "EARLY" state under the condition that the corresponding pattern has occurred.

At this time, phase differences corresponding to the "LATE" state and the "EARLY" state have the same magnitude and the opposite sign and frequency differences corresponding to the "LATE" state and the "EARLY" state have the same magnitude and the opposite sign.

As described above, since the error signal PFerr is a linear combination of weights corresponding to patterns, the error signal PFerr corresponds to a difference between first probability of being in the "EARLY" state and second probability of being in the "LATE" state.

That is, it can be understood that the oscillation control circuit 200 controls a difference between the first probability and the second probability to converge to zero so that the phase and frequency becomes at a locked state.

In the embodiment of FIG. 8, the weight W0 for the pattern 0 is determined as a difference between the probability of being in the "LATE" state in the case of the pattern 0 and the probability in the "EARLY" state in the case of the pattern 0.

This can be expressed as an equation as follows:

$$W0 = Pr(\text{LATE}|0) - Pr(\text{EARLY}|0) \quad \text{[Equation 2]}$$
$$= Pr(0|\text{LATE})Pr(\text{LATE})/Pr(0) -$$
$$Pr(0|\text{EARLY})Pr(\text{EARLY})/Pr(0).$$

For example, the weight W0 corresponding to the pattern 0 using the histograms of FIGS. 7A and 7B may be calculated using Equation 2, such that Pr(0|LATE)=0.25, Pr(LATE)=0.5, Pr(0)=0.250+0.250=0.5, Pr(0|EARLY)=0.25, Pr(EARLY)=0.5 to make W0=0.25*0.5/0.5−0.25*0.5/0.5=0.

Weights for the remaining patterns can be determined in a similar manner as described above.

As shown in FIGS. 7A, 7B, and 8, it can be seen that patterns belonging to the same group have the same frequency and weight.

Returning to FIG. 4, a phase difference graph and a frequency difference graph are generated using the calculated weights and histograms at step S300.

Figure 9A:
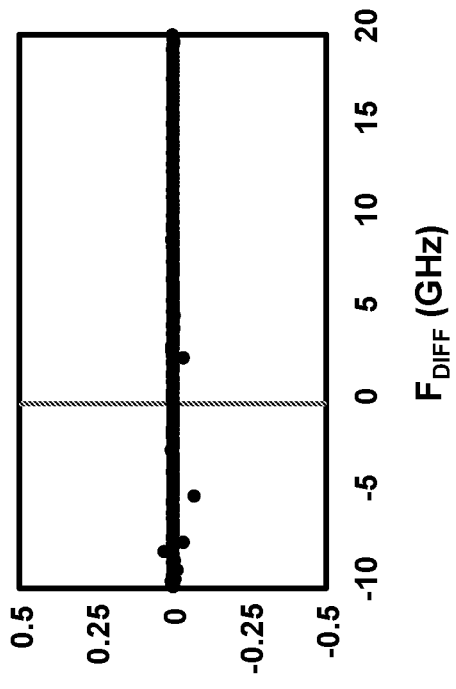
FIGS. 9A and 9B illustrate a phase difference graph and a frequency difference graph generated from the weights of FIG. 8, respectively, according to embodiments of the present disclosure.
Figure 9B:
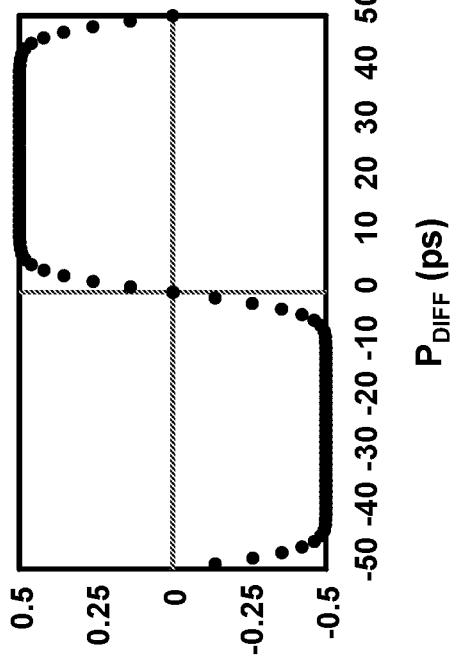

FIGS. 9A and 9B show a phase difference graph and a frequency difference graph created using the weights calculated as in FIG. 8, respectively, according to embodiments.

The value of the error signal PFerr given by Equation 1 may be calculated by applying the weights in FIG. 8 to a histogram corresponding to a phase difference.

When this process is applied to a plurality of histograms, the value of the error signal PFerr according to phase difference may be calculated and plotted as shown in the phase difference graph of FIG. 9A.

As described above, since the error signal PFerr is expressed as a linear combination of weights, it may indicate a difference between the probability of being in a first state (e.g., the "LATE" state) and the probability of being in a second state (e.g., the "EARLY" state.)

The phase difference graph of FIG. 9A satisfies a condition because the error signal PFerr converges to 0 when the phase difference approaches 0.

However, in the frequency difference graph of FIG. 9B, it cannot be confirmed whether the error signal PFerr converges to 0 as the frequency difference approaches 0.

This can be understood because the weights are calculated using a histogram without information on the frequency difference as shown in FIGS. 7A and 7B.

Accordingly, in FIG. 4, it is determined that the predetermined condition of step S400 is not satisfied and the process proceeds to step S500, where the representative histogram is changed, and the process proceeds to step S200, and the above-described operation is repeated.

FIG. 11 illustrates a table representing weights calculated based on new representative histograms in FIGS. 10A and 10B according to an embodiment.

The method of calculating the weight is the same as described above with reference to FIGS. 7A, 7B, and 8.

FIG. 12A shows a phase difference graph and FIG. 12B shows a frequency difference graph generated using the weights obtained as in FIG. 11, according to embodiments.

Since the method of generating the phase difference graph and the frequency difference graph is the same as described above, repeated descriptions are omitted.

FIG. 12A shows the error signal PFerr converge to zero when the phase difference approaches zero and FIG. 12B shows the error signals PFerr converge to zero when the frequency difference approaches zero.

In this case, the predetermined condition is satisfied at step S400 of FIG. 4.

Whether the predetermined condition at step S400 of FIG. 4 is satisfied or not may be determined by comparing a predetermined reference value with a combination of a first estimated value of the error signal when the phase difference is 0 in the phase difference graph and a second estimated value of the error signal when the frequency difference is 0 in the frequency difference graph according to a predetermined formula. For example, a sum of the first estimated value of the error signal and the second estimated value of the error signal or a weighted average of the first estimated value of the error signal and the second estimated value of the error signal may be calculated to combine the first estimated value and the second estimated value and compare the combined value with the predetermined reference value. In another embodiment, the predetermined condition at step S400 of FIG. 4 is satisfied when a first estimated value of the error signal at the phase difference of 0 in the phase difference graph is equal to or smaller than a first reference value and a second estimated value of the error signal at the frequency difference of 0 in the frequency difference graph is equal to or smaller than a second reference value.

The predetermined formula may vary according to embodiments, and in this embodiment, it is assumed that the weights of FIG. 11 satisfy the predetermined condition, and the procedure is terminated.

As described above, the method in FIG. 4 is similar to a machine learning method for determining weights of a neural network.

Accordingly, the method in FIG. 4 may be referred to as the training method of weights or the training method of a CRD device (e.g., the CDR device 1 of FIG. 2).

Although various embodiments have been illustrated and described, various changes and modifications may be made to the described embodiments without departing from the spirit and scope of the invention as defined by the following claims.

What is claimed is:

1. A clock and data recovery (CDR) device comprising:
a data sampler configured to output a data signal by sampling an input signal according to a first clock signal;
an edge sampler configured to output an edge signal by sampling the input signal according to a second clock signal, the second clock signal having substantially the same frequency as the first clock signal and having substantially an opposite phase to the first clock signal;
an error detection circuit configured to identify a plurality of patterns based on the data signal and the edge signal and generate an error signal according to occurrence frequencies of the identified plurality of patterns; and
an oscillation control circuit configured to generate a first oscillation control signal to control an oscillator generating the first and second clock signals according to the error signal.

2. The CDR device of claim 1, wherein the error detection circuit comprises:
a pattern detection circuit configured to generate a plurality of pattern signals corresponding to the plurality of patterns;
a histogram generation circuit configured to generate a histogram by accumulating numbers of occurrences of the plurality of pattern signals for a predetermined time interval; and
an error calculation circuit configured to generate the error signal according to the occurrence frequencies and a plurality of weights.

3. The CDR device of claim 1, further comprising a first multiplier configured to multiply a value of the error signal with a first constant,
wherein the oscillation control circuit is controlled by an output of the first multiplier.

4. The CDR device of claim 1, further comprising a phase comparator configured to compare a phase of the data signal and a phase of the edge signal to generate a comparison signal,
wherein the oscillator is controlled by the comparison signal.

5. The CDR device of claim 4, further comprising a second multiplier configured to multiply a value of the comparison signal of the phase comparator with a second constant,
wherein the oscillation control circuit is controlled by an output of the second multiplier.

6. The CDR device of claim 1, further comprising an analog receiving circuit for receiving a received signal to provide the input signal to the data sampler and the edge sampler.

7. The CDR device of claim 1, wherein each of the plurality of patterns is determined by a combination of a first value of the data signal, a second value of the edge signal, and a third value of the data signal, the first value, the second value, and the third value being sequentially provided from the data sampler and the edge sampler.

8. A training method of a clock and data recovery (CDR) device, wherein the CDR device samples an input signal according to a first clock signal to generate a data signal, samples the input signal according to a second clock signal to generate an edge signal, identifies a plurality of patterns based on the data signal and the edge signal, and generates an error signal by calculating a plurality of weights and occurrence frequencies of the plurality of patterns, the training method comprising:
generating a plurality of histograms according to a phase difference between the input signal and a clock signal, or a frequency difference between the input signal and the clock signal, or both, the clock signal being the first clock signal or the second clock signal;
calculating the plurality of weights based on a representative histogram selected from the plurality of histograms;
generating a phase difference graph and a frequency difference graph by applying the plurality of weights to the plurality of histograms; and
determining whether the phase difference graph and the frequency difference graph satisfy a predetermined condition.

9. The training method of claim 8, wherein the error signal corresponds to a difference between a first probability of being at a first state and a second probability of being at a second state,
wherein the first state corresponds to a state where the phase difference between the input signal and the clock signal is positive or a state where the frequency difference between the input signal and the clock signal is positive, and
wherein the second state corresponds to a state where the phase difference between the input signal and the clock signal is negative or a state where the frequency difference between the input signal and the clock signal is negative.

10. The training method of claim 9, wherein each of the plurality of weights corresponds to a difference between a first conditional probability of being at the first state when a corresponding pattern has occurred and a second conditional probability of being at the second state when the corresponding pattern has occurred.

11. The training method of claim 9, wherein the phase difference is positive when the clock signal lags the input signal, and the frequency difference is positive when a frequency of the clock signal is lower than that of the input signal, and wherein the phase difference is negative when the clock signal leads the input signal, and the frequency difference is negative when a frequency of the clock signal is higher than that of the input signal.

12. The training method of claim 8, wherein the plurality of histograms includes a first histogram corresponding to a first state and a second histogram corresponding to a second state, a magnitude of a first phase difference in the first state being the same as that of a second phase difference in the second state, a sign of the first phase difference being opposite to that of the second phase difference.

13. The training method of claim 8, wherein the plurality of histograms includes a first histogram corresponding to a first state and a second histogram corresponding to a second state, a magnitude of a first frequency difference in the first state being the same as that of a second frequency difference in the second state, a sign of the first frequency difference being opposite to that of the second frequency difference.

14. The training method of claim 8, wherein the plurality of histograms includes a first histogram corresponding to a first state and a second histogram corresponding to a second state, a magnitude of a first phase difference in the first state being the same as that of a second phase difference in the second state, a sign of the first phase difference being opposite to that of the second phase difference, wherein the plurality of histograms further includes a third histogram corresponding to a third state and a fourth histogram corresponding to a fourth state, a magnitude of a first frequency difference in the third state being the same as that of a second frequency difference in the fourth state, a sign of the first frequency difference being opposite to that of the second frequency difference, and wherein the plurality of histograms further includes fifth and sixth histograms, the fifth histogram being generated by combining the first histogram and the third histogram, the sixth histogram being generated by combining the second histogram and the fourth histogram.

15. The training method of claim 14, further comprising linearly combining a first plurality of occurrence frequencies of the first histogram and a second plurality of occurrence frequencies of the third histogram, respectively, to generate a third plurality of occurrence frequencies of the fifth histogram.

16. The training method of claim 8, further comprising:
combining a first estimated value of the error signal where the phase difference is zero in the phase difference graph and a second estimated value of the error signal where the frequency difference is zero in the frequency difference graph; and
comparing the combined value with a predetermined reference value to determine whether the phase difference graph and the frequency difference graph satisfy the predetermined condition.

17. The training method of claim 8, wherein the phase difference graph and the frequency difference graph satisfy the predetermined condition, when a first estimated value of the error signal where the phase difference is zero in the phase difference graph is equal to or less than a first reference value and a second estimated value of the error signal where the frequency difference is zero in the frequency difference graph is equal to or less than a second reference value.

18. The training method of claim 8, wherein the representative histogram is a first representative histogram, the method further comprising selecting a second representative histogram from the plurality of histograms when the predetermined condition is not satisfied.

* * * * *